US006639534B2

(12) United States Patent
Khoini-Poorfard et al.

(10) Patent No.: US 6,639,534 B2
(45) Date of Patent: Oct. 28, 2003

(54) DIGITAL-TO-ANALOG CONVERTER SWITCHING CIRCUITRY

(75) Inventors: Ramin Khoini-Poorfard, Austin, TX (US); Douglas R. Frey, Bethlehem, PA (US)

(73) Assignee: Silicon Laboratories, Inc., Austin, TX (US)

( * ) Notice: Subject to any disclaimer, the term of this patent is extended or adjusted under 35 U.S.C. 154(b) by 0 days.

(21) Appl. No.: 10/076,087

(22) Filed: Feb. 14, 2002

(65) Prior Publication Data

US 2003/0151533 A1 Aug. 14, 2003

(51) Int. Cl.[7] ................................................ H03M 1/66
(52) U.S. Cl. ....................................................... 341/144
(58) Field of Search ................................ 341/144, 118, 341/150, 131, 143, 155

(56) References Cited

U.S. PATENT DOCUMENTS 4,430,642 A 2/1984 Weigand et al.
4,473,818 A 9/1984 Youngquist
4,488,144 A 12/1984 Wollman
5,257,027 A 10/1993 Murota
5,389,928 A 2/1995 Coppero et al.
5,394,146 A 2/1995 Arimoto
5,689,259 A 11/1997 Ozguc
6,426,715 B1 * 7/2002 Westra ....................... 341/144

OTHER PUBLICATIONS

Adams, Robert, et al., "A 113–dB SNR Oversampling DAC with Segmented Noise–Shaped Scrambling", IEEE Journal of Solid–State Circuits, vol. 33, No. 12, Dec. 1998, pp. 1871–1878.

* cited by examiner

*Primary Examiner*—Brian Young
(74) *Attorney, Agent, or Firm*—Davis & Associates; William D. Davis

(57) ABSTRACT

A digital-to-analog conversion circuit includes first and second DACs. Switch circuitry couples a selected output of only one of the DACs to an output node at any given time. In one embodiment, a second output of the first DAC is coupled to the first output of the second DAC at a common node. The first output of the first DAC is coupled to a first switch node and a second output of the second DAC is coupled to a second switch node. A first switch couples the common node to the first switch node in response to a first switch signal. A second switch couples the common node to the second switch node in response to a second switch signal. The switch signals ensure that the common node is coupled through the first and second switches to only one of the first and second switch nodes at any given time.

31 Claims, 5 Drawing Sheets

DIGITAL-TO-ANALOG CONVERTER SWITCHING CIRCUITRY

FIELD OF THE INVENTION

This invention relates to the field of digital-to-analog converter circuitry. In particular, this invention is drawn to methods and apparatus for reducing glitches and extraneous noise in digital-to-analog converter circuitry.

BACKGROUND OF THE INVENTION

Digital-to-analog converter (DAC) circuitry is used in numerous electronics application. A DAC requires a finite amount of time to sense input codes and convert the codes to an analog value (e.g., current or voltage) that the DAC then provides at its output. A finite amount of time is also required for the output of the DAC to stabilize or settle upon the analog value. These time elements establish an upper boundary on the performance bandwidth of the digital-to-analog conversion process.

A current steering DAC architecture is particularly desirable for speed advantages over other architectures. A current steering DAC generates a differential current output that is typically applied to a current-to-voltage converting amplifier to produce a differential voltage output. Current steering DACs, however, tend to have relatively poor dynamic performance.

Transient voltages will appear at the DAC output due to the periodic code updates applied to the DAC. Although the effect is dependent upon the specific DAC architecture, the transients frequently manifest as a "smearing" of the analog output. This smearing can introduce distortion in a baseband signal even after application of a reconstruction filter. More succinctly, input code transitions for current steering DACs frequently result in a "glitch" in the output signal.

Various attempts have been made to reduce or eliminate the glitch for current steering DACs. Generally, the attempts focus on reducing the height or the width of glitch.

For example, one current steering DAC architecture uses thermometer encoding for the DAC internal current sources. Although this approach ensures that the height of the glitch is less than the smallest DAC current step size, one disadvantage of such an architecture is that $2^N$ current sources are required, where N is the number of bits of resolution.

Another approach is to use a row of latches to resynchronize the edges of the input binary codes at the DAC input such that the delays between different codes are minimized. This approach attempts to reduce the width of the glitch. Aside from noise and area impact, this approach does not fully eliminate the glitch due to the residual mismatch in latch gate delays and DAC switches.

SUMMARY OF THE INVENTION

In view of limitations of known systems and methods, methods and apparatus for controlling digital-to-analog conversion circuitry are disclosed.

One digital-to-analog conversion circuit includes first and second digital-to-analog converters (DACs). Switch circuitry couples a selected output of each DAC to an output node. The switch circuitry couples the selected output of only one of the first and second DACs to the output node at any given time. In one embodiment, the switch circuitry couples the differential output of a selected exclusive one of the first and second DACs to a pair of output nodes. In one embodiment, when the differential output of the selected DAC is coupled to the output node pair, the differential output of the non-selected DAC is coupled to a throwaway node.

One embodiment of a sampling apparatus includes a first and a second digital to analog converter (DAC). Each DAC has a first and a second output. The second output of the first DAC is coupled to the first output of the second DAC at a common node. The first output of the first DAC is coupled to a first switch node and a second output of the second DAC is coupled to a second switch node. The apparatus includes a first switch for coupling the common node to the first switch node and a second switch for coupling the common node to the second switch node.

The first switch couples the common node to the first switch node in response to a first switch signal. The second switch couples the common node to the second switch node in response to a second switch signal. In one embodiment, active regions of the first and second switch signals do not overlap to ensure that the common node is coupled through the first and second switches to only one of the first and second switch nodes at any given time.

In one embodiment the first and second switch nodes are connected to input nodes of a differential amplifier. In an alternative embodiment, the sampling apparatus further comprises buffer circuitry wherein the first and second switch nodes are coupled to the input nodes of the differential amplifier through the buffer circuitry.

In various embodiments the DACs, switches, buffer circuitry, and differential amplifier may be fabricated on an integrated circuit die such that they share a common semiconductor substrate within an integrated circuit package. The integrated circuit package may further include a power amplifier for driving external analog circuitry such as a telephone subscriber line.

Other features and advantages of the present invention will be apparent from the accompanying drawings and from the detailed description that follows below.

BRIEF DESCRIPTION OF THE DRAWINGS

The present invention is illustrated by way of example and not limitation in the figures of the accompanying drawings, in which like references indicate similar elements and in which.

DETAILED DESCRIPTION

Figure 1:
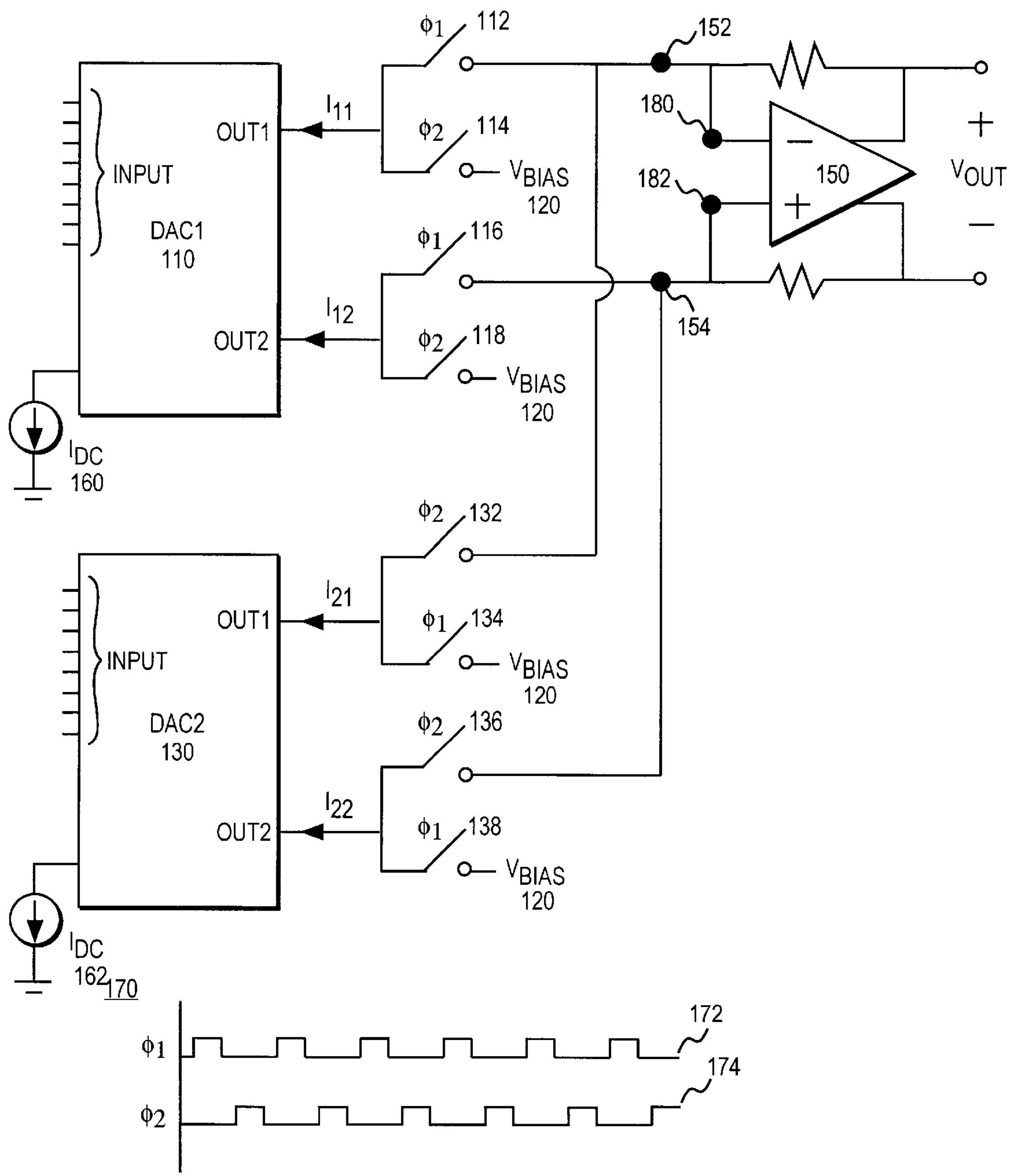
FIG. 1 illustrates an embodiment of a two DAC sampling system.

FIG. 1 illustrates one embodiment of circuitry for a digital-to-analog conversion system. Glitches in the output of the DACs can occur for a number of reasons. The inputs, for example, may not arrive at precisely the same time (inter-bit delay). The processing of some bits may take longer than others (intra-bit delay). The result is that the outputs of the DACs will have glitches due to transitions in input codes. The glitches tend to be differential in nature such that the same glitch signal of opposite sign appears at each output of a given DAC. The differential glitch will be exacerbated if the glitch is present on the input nodes of a differential amplifier coupled to the DAC output.

In order to reduce glitches in any input signals to differential amplifier due to the updating of the DAC, two DACS are used with switching circuitry designed to provide the output of one DAC while the other is being updated. The use of two DACs switched in this manner avoids having the transients or glitches resulting from changes in codes input to the DACs appear at the input nodes of differential amplifier.

In one embodiment, each DAC (110, 130) produces a differential current output that is applied to a current-to-voltage converting amplifier 150 to produce a differential voltage $V_{OUT}$. Each DAC is designed so that the sum of its output currents is substantially constant regardless of the applied inputs. Thus, for example, $I_{11}+I_{12}$ and $I_{21}+I_{22}$ are substantially constant although the individual currents may vary considerably. Such DAC architectures are frequently referred to as current steering DACs.

The dual DAC system uses a two phase clock ($\phi_1$, $\phi_2$). Switches 112, 114, 116, and 118 switch the outputs of DAC1 between the input of current-to-voltage differential amplifier 150 and a bias voltage node ($V_{BIAS}$ 120). Similarly, switches 132, 134, 136, and 138 switch the outputs of DAC2 between the input of current-to-voltage amplifier 150 and the bias voltage node 120. Switches 112–118 and 132–138 may also be referred to individually as commutators and collectively as commutation circuitry.

When $\phi_1$ is active, switches 112 and 116 couple the outputs of DAC1 to the input of the current-to-voltage amplifier 150 at nodes 152 and 154. At the same time, the outputs of DAC2 are coupled to the same bias voltage node 120 (and thus each other) through switches 134 and 138. Thus when $\phi_1$ is active, $V_{OUT}$ corresponds to the output of DAC1.

When $\phi_2$ is active, switches 132 and 136 couple the outputs of DAC2 to the input of the current-to-voltage amplifier 150 at nodes 152 and 154. At the same time, the outputs of DAC1 are coupled to the same bias voltage node 120 (and thus each other) through switches 114, and 118.

The two phase clock signal 170 includes $\phi_1$ 172 and $\phi_2$ 174. In the illustrated embodiment, each switch is controlled directly by one phase of the two phase clock signal 170. Thus the switch control signals are independent of the value of any DAC input code (i.e., data). The two phase clock is designed so that the active regions of each signal do not overlap. This ensures that at most one DAC is coupled to provide its outputs to the current-to-voltage amplifier at any given time. The switch circuitry thus couples a differential output of a selected exclusive one of the first and second DACs to the output node pair 152 and 154.

Typically, $\phi_1$ and $\phi_2$ are derived from a master clock signal appearing in the same integrated circuit. A two phase clock generator, for example, can be used to generate a multiphase clock signal from the master clock signal. As a result of the multiphase clock signal and the switching circuitry, the analog signal at output node pair 152 and 154 is effectively a time interleaved analog signal generated by multiplexing the differential outputs of DAC1 and DAC2.

The bias voltage voltage node 120 serves effectively as a "throwaway" node. The "glitches" are not actually removed from the output of any DAC. Instead, the switching circuitry ensures that the glitches are re-directed to a throwaway node which is entirely independent of the inputs of the differential amplifier 150. The bias voltage $V_{BIAS}$ is adjusted to be at substantially the same potential as the virtual ground input nodes 180, 182 of the differential amplifier 150 to ensure that the switching does not impair performance of the DACs.

When the outputs of a DAC are switched to the throwaway node, the outputs are effectively shorted together. Due to the differential nature of the glitch, the glitch elements associated with the shorted DAC outputs tend to cancel each other out. Even if the glitches are not canceled out, however, any residual glitch is re-directed to the throwaway node instead of the differential amplifier inputs.

In one embodiment, differential amplifier 150 is a class A amplifier. The output of the differential amplifier may be coupled to a subsequent power amplification stage, if necessary. The power amplification stage might be a class AB amplification stage, for example.

In an alternative embodiment, differential amplifier 150 performs the function of differential current-to-voltage conversion and power amplification. The use of a class AB amplification stage at this point eliminates the need for a subsequent power amplification stage. In the preceding embodiment with independent stages, the input of the class AB amplification stage is buffered from the switching circuitry by the class A amplification stage. When the functions of differential current-to-voltage conversion and power amplification are combined into a single stage, however, the input of the class AB amplification stage is coupled directly to the switching circuitry without the benefit of a buffering class A amplification stage.

When the DACs, differential current-to-voltage converting power amplifier, and switching circuitry are located within the same integrated circuit, clock signals within the integrated circuit may interact with the power amplifier circuitry to produce an amplitude modulated (AM) version of the clock signals that appears at the DAC and the current-to-voltage converting power amplifier interface.

When this AM signal is present in a system switching between two DACs, the AM signal can be demodulated by the switching action at the output of the DACs. This demodulation produces an extraneous baseband signal that is a distorted version of the true baseband signal produced by the DAC. The introduction of the extraneous signal produces undesirable harmonic distortion at the output of the power amplifier. The harmonic distortion can significantly impair the ability to reliably transmit data.

If the DAC outputs were driven by ideal current sources, the circuitry of FIG. 1 should be immune to clock noise appearing at input nodes 152 and 154 of the current-to-voltage amplifier 150. The output impedance of each output line, however, is finite and typically can be modeled as a ground connected capacitor. As a result of the commutation of switches 112–118 and 132–138, nodes 152 and 154 are effectively presented with a switched capacitor resistance between each of nodes 152 and 154 and signal ground.

If there is any clock noise appearing at nodes 152 and 154 that is correlated to clock signals $\phi_1$ and $\phi_2$ then the clock noise can be down converted by the synchronous switching to produce undesirable basedband signals. These baseband signals add to the DAC output signals (nodes 180, 182 connected to nodes 152, 154, respectively). As previously indicated, the clock signals $\phi_1$ and $\phi_2$ are derived from the master clock signal such that there is a correlation between $\phi_1$ and $\phi_2$ and the clock noise at nodes 152 and 154.

Thus if the interaction of the master clock signal with the DACs, ground, power supplies, or semiconductor substrate is dependent upon the voltage signal appearing at the output of amplifier 150, then an amplitude modulated (AM) clock signal can appear at the inputs 180, 182 of amplifier 150. The action of switches 112–118 and 132–138 can then demodulate the AM signal which will result in deleterious effects on the data attempting to be sampled or communicated.

Figure 2:
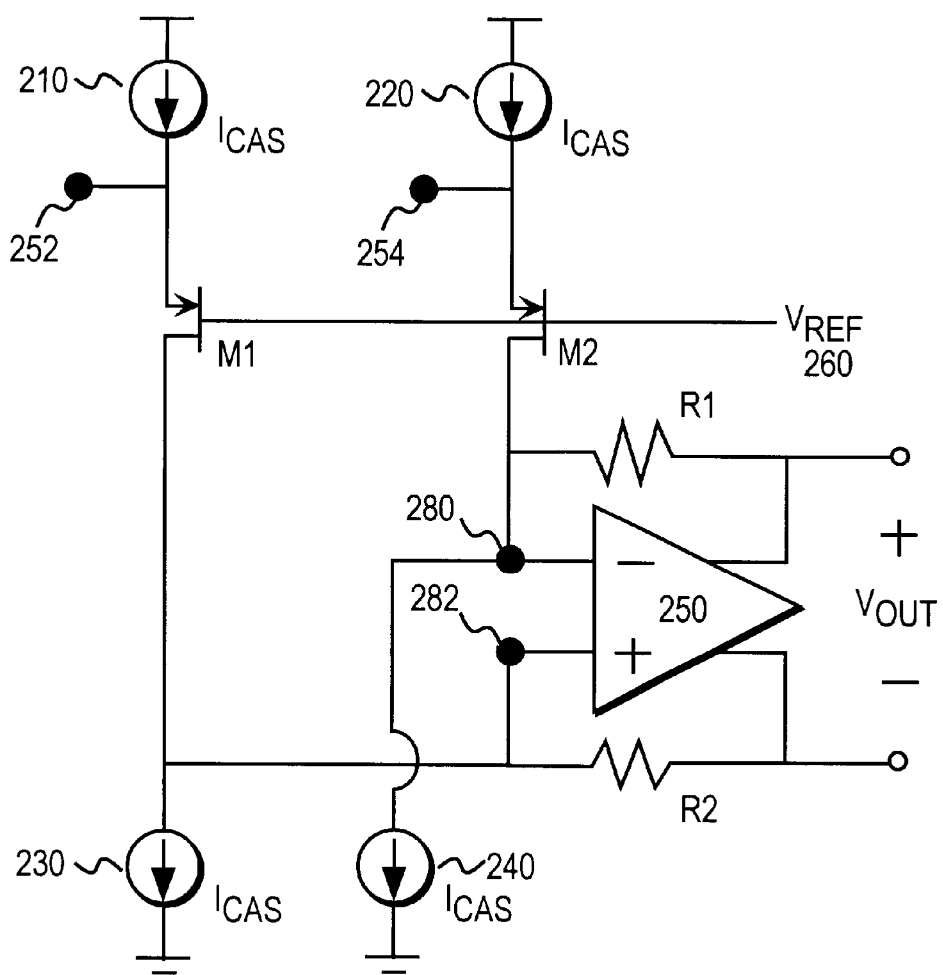
FIG. 2 illustrates one embodiment of buffering circuitry for the DAC circuitry of FIG. 1.

FIG. 2 illustrates buffer circuitry for the current-to-voltage converting amplifier 250. The DACs are coupled through the switching circuitry to buffer circuitry input nodes 252 and 254 (corresponding to nodes 152, 154 of FIG. 1). The buffer circuitry is connected to the amplifier input nodes 280, 282.

Cascode connected metal oxide semiconductor field effect transistors (MOSFETs) M1 and M2 buffer the input nodes from the current-to-voltage converter 250. The $I_{CAS}$ current sources 210, 220, 230, and 240 bias transistors M1 and M2 so that the current signals from the DACs may be communicated without distortion or offset. If offsets are not important or even desired, biasing current sources 230 and 240 may be eliminated in an alternative embodiment.

The advantage of this buffer circuitry is that the clock noise appearing at amplifier input nodes 180 and 182 is buffered from the switching circuitry of FIG. 1 thus reducing the effects of any demodulated AM signals.

One disadvantage of this approach is that the current sources 210–240 must have greater output capabilities than the maximum current output capability of either DAC. Referring to FIG. 1, current sources 210–240 must each exceed the $I_{DC}$ current sources 160, 162 associated with each DAC. Such large current sources tend to introduce noise into the digital-to-analog conversion circuitry.

Another disadvantage becomes apparent for significant signal swings. Even if adequate drive current is supplied by the $I_{CAS}$ current sources, there may be significant signal swings at the drains of M1 and M2. These signal swings are embodied as voltage swings at the source of M1 and M2. The sources, however, are coupled to nodes 252 and 254 which are in turn coupled (through the switch circuitry) to the output of the DACs. The performance of some DACs is adversely affected by significant voltage swings at the output nodes of the DAC. Thus the buffering circuitry is adequate only for small signal swings depending upon the DAC architecture.

Although feedback circuitry may be used to improve the performance of the buffer circuitry, the feedback circuitry adds more components and complexity and may reduce the operating bandwidth of the buffer circuitry and hence the DACs.

Figure 3:
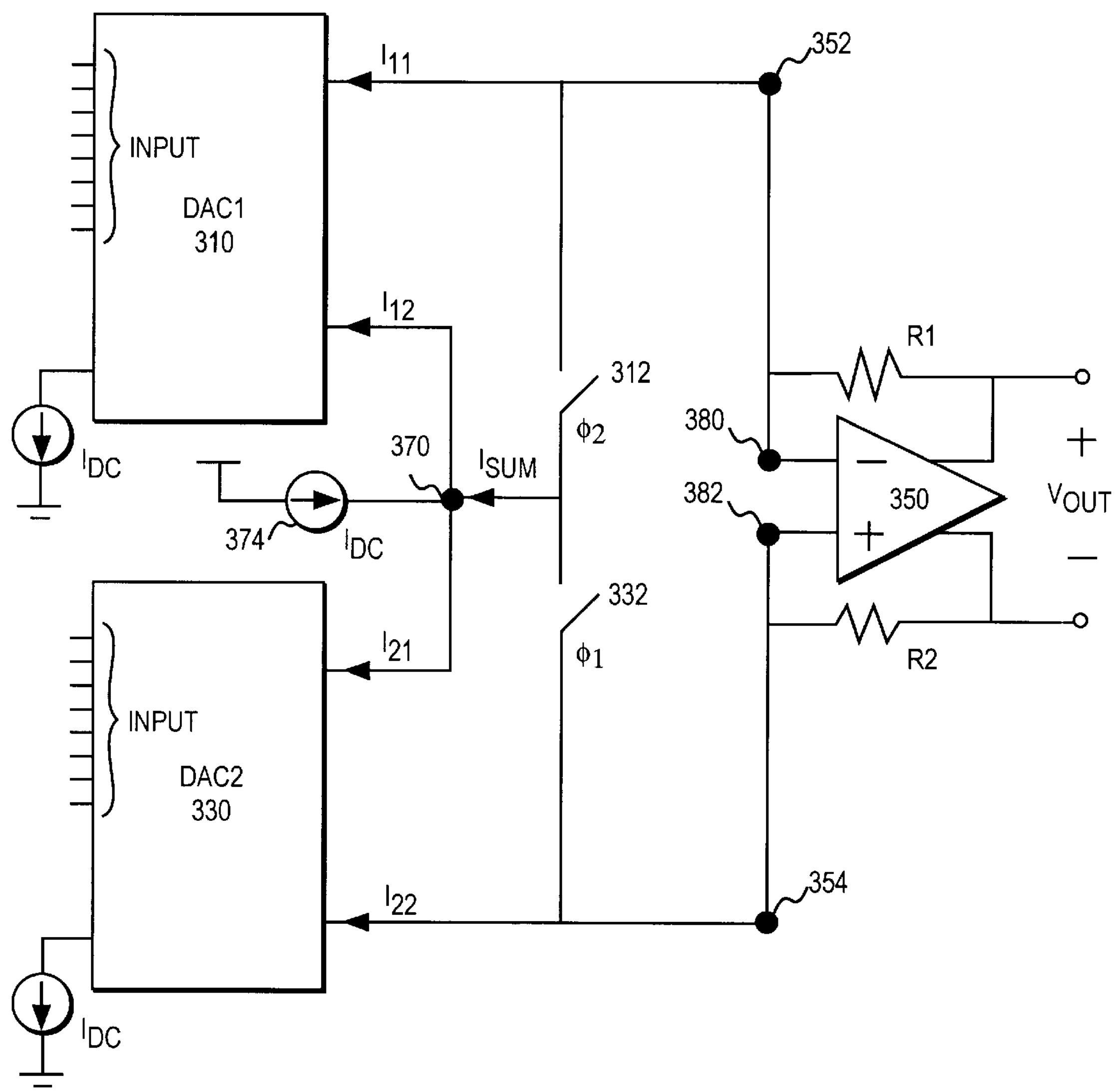
FIG. 3 illustrates a one embodiment of an improved two DAC sampling system.

FIG. 3 illustrates improved switching circuitry for the dual DAC system. Each DAC has a first and a second output. In one embodiment, the DACs are current steering DACs. The eight switches of FIG. 1 are replaced with two switches.

The first output of DAC1 310 is coupled to a first switch node 352. In the illustrated embodiment, the first switch node 352 is connected to a first differential amplifier 350 input node 380. A second output of DAC2 330 is coupled to a second switch node 354. In the illustrated embodiment, the second switch node 354 is connected to the second differential amplifier input node 382. The second output of DAC1 is coupled to the first output of DAC2 at a common node 370.

Switch 332 couples the common node to the first switch node 352 in response to switch signal $\phi_1$. When switch signal $\phi_1$ is asserted, switch 332 also effectively shorts the outputs of DAC2. DAC2 may be updated while switch signal $\phi_1$ is asserted.

Switch 312 couples the common node 370 to the second switch node 354 in response to switch signal $\phi_2$. When switch signal $\phi_2$ is asserted, switch 312 also effectively shorts the outputs of DAC1. DAC1 may be updated while switch signal $\phi_2$ is asserted.

The waveforms of the switch signals are out-of-phase so that the active regions of $\phi_1$ and $\phi_2$ do not overlap each other. Thus only one of switches 312 and 332 is closed at any given time. As with FIG. 1, a two phase clock configured so that the active regions of $\phi_1$ and $\phi_2$ do not overlap may be used to generate switch signals $\phi_1$ and $\phi_{2.}$ During the assertion of $\phi_1$, DAC1 310 has its outputs coupled to the inputs of current-to-voltage converting amplifier 350. At the same time the inputs for DAC2 330 are shorted together. As long as the DACs are designed such that the sum of their respective output currents is substantially constant, the circuitry functionally performs the same as that of FIG. 1. When $\phi_2$ is asserted, the outputs of DAC1 are shorted together and the outputs of DAC2 are coupled to the current-to-voltage converting amplifier. The circuitry of FIG. 3 tends to eliminate glitches by coupling a given DACs outputs together. Due to the differential nature of the glitch, the glitch elements associated with the shorted DAC outputs tend to cancel each other out.

When the components of FIG. 3 reside on a same integrated circuit die, the DACs and the switches tend to be closely matched. Thus the current, $I_{SUM}$, flowing through switches 312 and 314 is nearly zero or at least small such that $I_{SUM} << I_{DC}$. Given that the switches of FIG. 3 are required to carry a fraction of the current of the switches of FIG. 1, switches 312–318 and 332–338 can be fabricated using considerably smaller components. The smaller size saves space in an integrated circuit and tends to reduce clock feedthrough associated with the switches.

The digital inputs presented to DACs 310 and 330 are likely the same or close. The DACs are receiving the same data with perhaps a half clock cycle skew. The maximum difference in output values between DAC1 and DAC2 is related to the maximum code-to-code deviation in the incoming data.

Typically, the maximum code-to-code deviation is significantly less than full scale.

The input codes for oversampling converters, for example, change at a fraction of the Nyquist frequency of the DAC. The code-to-code transitions for oversampling converters are guaranteed to be very small. Thus the $I_{SUM}$ of FIG. 3 will be considerably smaller than the $I_{DC}$ of FIG. 1.

One disadvantage of the circuitry of FIG. 3 is that the switches are directly coupled (i.e., without buffer circuitry) to the amplifier input nodes 380 and 382 at nodes 352 and 354. As a result, the circuitry may experience the same AM demodulation of clock noise with the corresponding deleterious effects particularly if differential amplifier 350 is a class AB amplifier.

Figure 4:
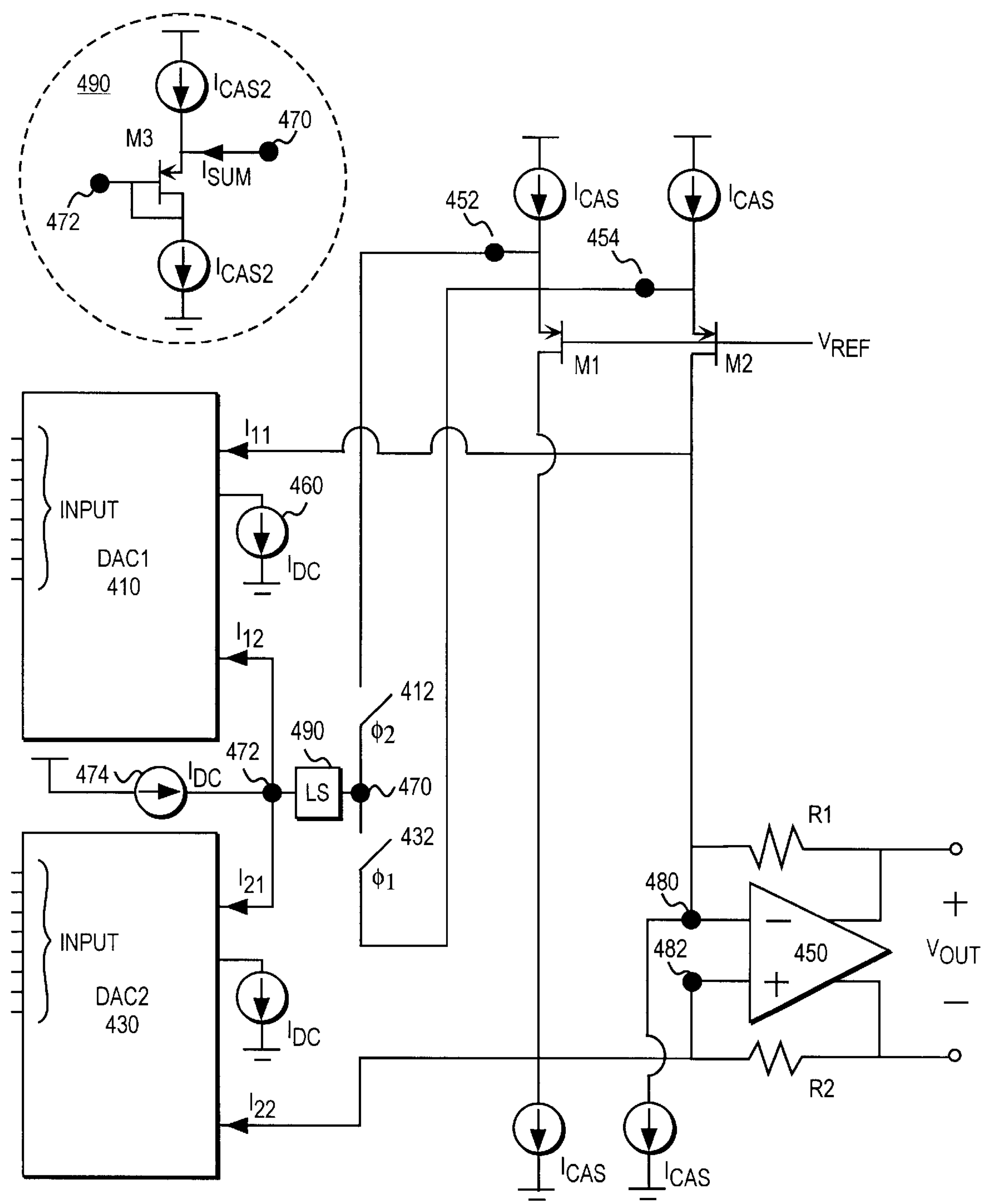
FIG. 4 illustrates one embodiment the improved two DAC sampling system further incorporating the buffering circuitry of FIG. 2.

FIG. 4 illustrates another embodiment of a dual DAC system. The simplified switching circuitry of FIG. 3 is combined with the buffer circuitry in of FIG. 2. Given that the signal swings experienced by $I_{SUM}$ are very small and that $I_{SUM}$ is nearly zero, the current sources $I_{CAS}$ do not require the capability of generating currents that can exceed $I_{DC}$.

The DACs (410, 430) are coupled through the switching circuitry to buffer circuitry input nodes 452 and 454. The buffer circuitry is connected to the input nodes 480, 482 of current-to-voltage converting amplifier 450. As with FIG. 2, the input nodes 480 and 482 of amplifier 450 are isolated from the switches 412 and 432 by the buffer circuitry. As a result of the decreased current carrying requirements switches 412 and 432 can be fabricated much smaller than the switches 112–118 and 132–138 of FIG. 1. As a result, the switching circuitry of FIG. 4 can operate at a higher switching rate than the switching circuitry of FIG. 1.

The circuitry of FIG. 4 includes level shifting circuitry 490 for the common node 472. The expanded view of level shifting circuitry 490 illustrates the detailed connections of a diode coupled MOSFET transistor M3 to nodes 470 and 472.

The purpose of M3 is to enable matching the voltage across each $I_{DC}$ current source (e.g., 460) to the voltage at the differential amplifier input nodes 480 or 482 ($V_{480} \approx V_{482}$ as a result of the virtual ground at the differential amplifier inputs). Each DAC can be modeled as having a capacitor parallel to its associated current source. As the $I_{DC}$ current is steered to $I_{11}$ or $I_{12}$, for example, sudden variations in the voltage across this capacitor can affect the operation of the DAC. To avoid this undesirable operation, the voltage at node 472 is maintained at the same voltage as node 480 through the use of M3. $V_{REF}$ is also maintained at $V_{480}$.) Diode connected transistor M3 and current sources $I_{CAS2}$ ($I_{CAS2} < I_{CAS}$) co-operate to level shift node 472 such that $V_{472} \approx V_{480}$.

Figure 5:
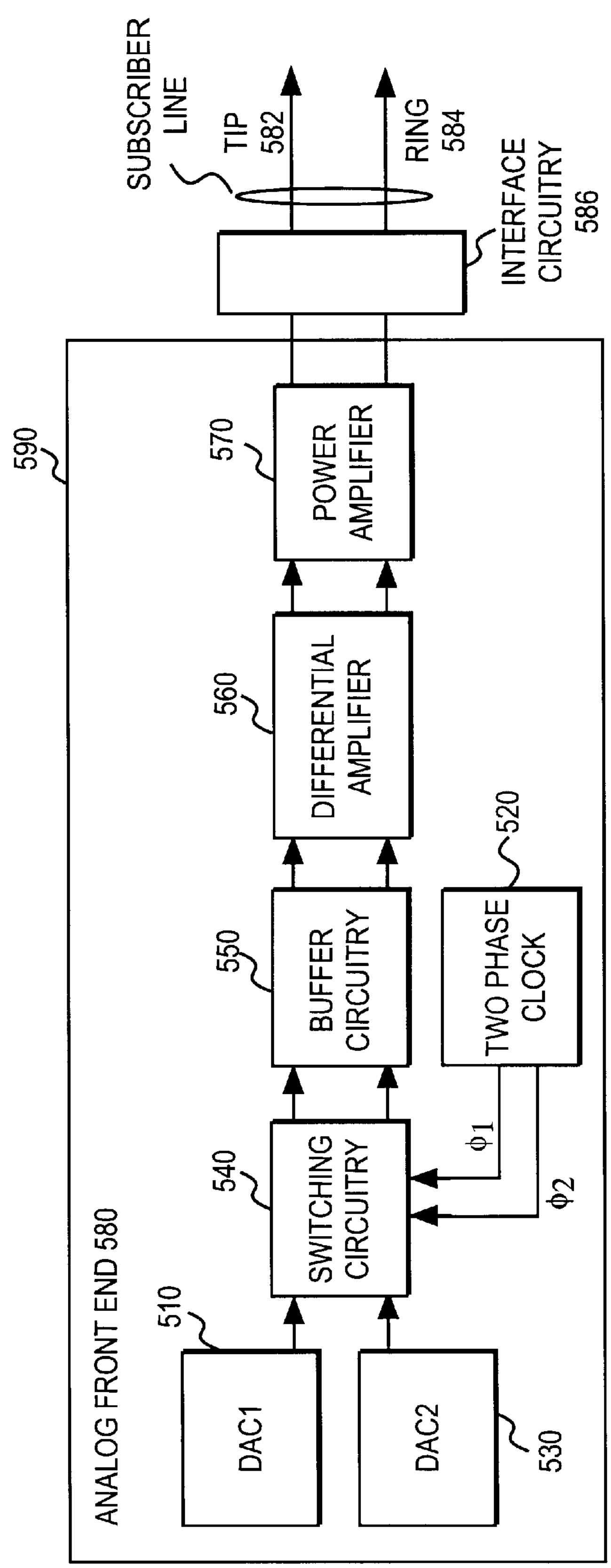
FIG. 5 illustrates a function block diagram of a two DAC sampling system fabricated on a common semiconductor substrate.

FIG. 5 illustrates one application for the digital-to-analog conversion circuitry. The circuitry is illustrated in functional block form. An analog front end 580 is used to drive a telephone subscriber line including the tip 582 and ring 584 lines. Modems such as digital subscriber line modems are an example of such an application.

The DACs 510, 530, switching circuitry 540, and differential amplifier 560 are fabricated on a common semiconductor die 590. In the illustrated embodiment, the analog front end 580 includes a two phase clock generating circuit 520 and buffer circuitry 550 on the same semiconductor die. A power amplifier 570 is also included on the same die.

Buffer circuitry 550 permits the use of class A or class AB type differential amplifier stage 560. In the event that differential amplifier 560 is a class A amplifier, buffer circuitry 550 may be eliminated. Similarly, if the differential current-to-voltage conversion and power amplification functions are combined into a single amplification stage, then the subsequent power amplifier stage 580 may be eliminated.

The output of the power amplification stage may be coupled to the subscriber line through interface circuitry 586 external to the integrated circuit package, if necessary. Thus in one embodiment, the DACs, switching circuitry, differential amplifier, power amplifier, and buffer circuitry share a common semiconductor substrate within the same integrated circuit package. These components may thus collectively be fabricated on the same integrated circuit die 590. In one embodiment, the integrated circuit die is a complementary metal oxide semiconductor (CMOS) integrated circuit die.

In the preceding detailed description, the invention is described with reference to specific exemplary embodiments thereof. Various modifications and changes may be made thereto without departing from the broader spirit and scope of the invention as set forth in the claims. The specification and drawings are, accordingly, to be regarded in an illustrative rather than a restrictive sense.

What is claimed is:

1. A circuit apparatus for performing digital-to-analog conversion, comprising:

first and second digital-to-analog converters (DAC), each having a first and a second output, wherein the second output of the first DAC is coupled to the first output of the second DAC at a common node, wherein the first output of the first DAC is coupled to a first switch node, wherein the second output of the second DAC is coupled to a second switch node;

a first switch for coupling the common node to the first switch node; and a second switch for coupling the common node to the second switch node.

2. The apparatus of claim 1 wherein each DAC provides a differential output signal in response to a given input, wherein a sum of the first and second outputs of each DAC is substantially constant independent of any input.

3. The apparatus of claim 1 further comprising:

a differential amplifier, wherein the first switch node is coupled to a first input node of the differential amplifier, wherein the second switch node is coupled to a second input node of the differential amplifier.

4. The apparatus of claim 3 wherein the differential amplifier is one of a class A and a class AB amplifier.

5. The apparatus of claim 3 wherein the differential amplifier is a current-to-voltage amplifier.

6. The apparatus of claim 1 wherein the first switch couples the common node to the first switch node in response to a first switch signal, wherein the second switch couples the common node to the second switch node in response to a second switch signal.

7. The apparatus of claim 6 wherein active regions of the first switch signal do not overlap active regions of the second switch signal such that the common node is coupled through the first and second switches to only one of the first and second switch nodes at any given time.

8. The apparatus of claim 1 wherein the first and second DACs and the first and second switches are fabricated on a same semiconductor substrate.

9. The apparatus of claim 1 further comprising:

a buffer circuit, wherein the first switch node is coupled to a first buffer input node of the buffer circuit, wherein the second switch node is coupled to a second buffer input node; and a differential amplifier, wherein a first buffer output node of the buffer circuit is coupled to a first input node of the differential amplifier, wherein a second buffer output node of the buffer circuit is coupled to a second input node of the differential amplifier, wherein the buffer circuit substantially isolates the first and second input nodes of the differential amplifier from any noise at the first and second switch nodes.

10. The apparatus of claim 9 wherein the first and second DACs, the first and second switches, the buffer circuit, and the differential amplifier are fabricated on a same integrated circuit die.

11. A method of performing digital-to-analog conversion, comprising the steps of:

a) providing a first and a second digital-to-analog converter (DAC), each having a first output and a second output, wherein the first output of the first DAC is coupled to a first switch node, wherein the second output of the second DAC is coupled to a second switch node, wherein the second output of the first DAC is coupled to the first output of the second DAC at a common node;

b) coupling the common node to the second switch node in response to a first switch signal; and c) coupling the common node to the first switch node in response to a second switch signal.

12. The method of claim 11 wherein the first and second switch signals have waveforms with non-overlapping active regions such that the common node is coupled through the first and second switches to only one of the first and second nodes at any given time.

13. The method of claim 11 further comprising the step of:

d) updating the first DAC while the second switch signal is active.

14. The method of claim 11 further comprising the step of:

d) updating the second DAC while the first switch signal is active.

15. The method of claim 11 further comprising the step of:

d) providing a differential amplifier having input nodes connected to the first and second switch nodes.

16. The method of claim 11 further comprising the steps of:

d) providing buffer circuitry; and e) providing a differential amplifier, wherein input nodes of the differential amplifier are coupled to the first and second switch nodes through the buffer circuitry, wherein the buffer circuitry substantially isolates the differential amplifier input nodes from noise at the first and second switch nodes.

17. A digital-to-analog conversion circuit apparatus, comprising:

first and second digital-to-analog converters (DAC), each having a first and a second output, wherein the second output of the first DAC is coupled to the first output of the second DAC at a common node, wherein the first output of the first DAC is coupled to a first switch node, wherein the second output of the second DAC is coupled to a second switch node;

a first switch for coupling the common node to the first switch node; and a second switch for coupling the common node to the second switch node, wherein the DACs and switches are formed on a same integrated circuit die.

18. The apparatus of claim 17 further comprising:

a buffer circuit; and a differential amplifier, wherein a first input node and a second input node of the differential amplifier are coupled to the first and second switch nodes, respectively, through the buffer circuit, wherein the buffer circuit substantially isolates the first and second input nodes of the differential amplifier from any noise at the first and second switch nodes, wherein the buffer circuit and differential amplifier are formed on the integrated circuit die.

19. The apparatus of claim 17 wherein the DACs are current steering DACs.

20. The apparatus of claim 17 wherein the integrated circuit die is a complementary metal oxide semiconductor integrated circuit die.

21. The apparatus of claim 17 further comprising:

a two phase clock providing a first clock signal to control the first switch and a second clock signal to control the second switch, the two phase clock formed on the integrated circuit die, wherein first and second clock signals have distinct phases to ensure that the common node is coupled to only one of the first and second switch nodes at any given time.

22. A digital-to-analog conversion circuit apparatus, comprising:

a first and a second digital-to-analog converter (DAC); and switch circuitry coupling a selected output of only one of the first and second DACs to an output node at any given time.

23. The apparatus of claim 22 wherein the switch circuitry is controlled by switch control signals independent of any DAC input data.

24. The apparatus of claim 23 wherein the switch circuitry periodically alternates between coupling the selected output of the first DAC and the selected output of the second DAC to the output node.

25. The apparatus of claim 23 further comprising:

a throwaway node, wherein the switch circuitry couples the outputs of the second DAC to the throwaway node when coupling the outputs of the first DAC to the output nodes, wherein the switch circuitry couples the outputs of the first DAC to the throwaway node when coupling the outputs of the second DAC to the output nodes.

26. A digital-to-analog conversion circuit apparatus, comprising:

a first and a second digital-to-analog converter (DAC); and switch circuitry for coupling a differential output of a selected exclusive one of the first and second DACs to a pair of output nodes.

27. The apparatus of claim 26 wherein the switch circuitry is controlled by switch control signals independent of any DAC input data.

28. The apparatus of claim 27 further comprising:

a multiphase clock for controlling the switch circuitry to time interleave the differential outputs of the first and second DACs onto the pair of output nodes.

29. The apparatus of claim 27 wherein when the differential output of the selected DAC is coupled to the output node pair, the differential output of the non-selected DAC is coupled to a throwaway node.

30. The apparatus of claim 27 wherein the output nodes are coupled to a differential amplifier.

31. The apparatus of claim 30 wherein the differential amplifier is a selected one of a class A and a class AB amplifier.

* * * * *